(12) United States Patent
Van Stralen

(10) Patent No.: US 6,629,294 B2
(45) Date of Patent: Sep. 30, 2003

(54) TOOL AND METHOD FOR IMPROVING THE QUALITY OF BOARD DESIGN AND MODELING

(75) Inventor: Nick Andrew Van Stralen, Ballston Lake, NY (US)

(73) Assignee: General Electric Company, Niskayuna, NY (US)

( * ) Notice: Subject to any disclaimer, the term of this patent is extended or adjusted under 35 U.S.C. 154(b) by 292 days.

(21) Appl. No.: 09/803,431

(22) Filed: Mar. 9, 2001

(65) Prior Publication Data

US 2002/0004931 A1 Jan. 10, 2002

Related U.S. Application Data

(60) Provisional application No. 60/188,512, filed on Mar. 10, 2000.

(51) Int. Cl.[7] .............................................. G06F 17/50
(52) U.S. Cl. ............................................. 716/4; 716/18
(58) Field of Search ............................. 716/4, 5, 6, 12, 716/18

(56) References Cited

U.S. PATENT DOCUMENTS 6,363,509 B1 * 3/2002 Parulkar et al. ............. 714/738
6,470,482 B1 * 10/2002 Rostoker et al. ................ 716/6
6,519,754 B1 * 2/2003 McElvain et al. ............ 716/18

* cited by examiner

Primary Examiner—Sara Crane
(74) Attorney, Agent, or Firm—John F. Thompson; Patrick K. Patnode

(57) ABSTRACT

The present invention provides a design tool and method which creates a VHSIC Hardware Description Language (VHDL) board model that can be used by digital engineers to verify their ASIC and FPGA designs. (VHSIC is an acronym for Very High Speed Integrated Circuits.) The board model is used as part of the test bench that tests the functionality of the board. Any models of the component parts can be instantiated in the board model using a "configuration" statement in the VHDL. Any inconsistencies between the board requirements and the ASIC and FPGA specifications can be identified.

38 Claims, 5 Drawing Sheets

TOOL AND METHOD FOR IMPROVING THE QUALITY OF BOARD DESIGN AND MODELING

CROSS REFERENCE TO RELATED APPLICATIONS

This application claims priority to provisional patent application Ser. No. 60/188,512 filed Mar. 10, 2000.

BACKGROUND OF THE INVENTION

This invention relates to improvements in the quality of printed circuit board (PCB) design, application specific integrated circuit (ASIC) design and field programmable gate array (FPGA) design by using a board simulation model that is substantially identical to the board actually being fabricated to ensure that the board design will support the desired functionality, including ASIC, FPGA and other components to be mounted on the board.

In recent years, the complexity of printed circuit boards has increased rapidly. As a result, the design cycle cost tends to increase and the probability of first pass success decreases. To combat these trends, engineers are using new tools and techniques to increase the probability of first pass success. Design engineers are able to simulate entire boards or subsystems accurately, using analog or digital models of the parts. These simulations verify both the functionality of the parts and, perhaps more importantly, the interaction of the parts. Other digital design engineers may be defining the behavior of some of the board components, such as application specific integrated circuits (ASICs) or field programmable gate arrays (FPGAs). Still other engineers enter the board design in electronic design automation (EDA) tools to fabricate the board. The quality of the simulation, the ASIC and FPGA designs and the netlist that is generated by the EDA board fabrication tools can be improved by using a board simulation model that is substantially identical to the board actually being fabricated. This simulation board model can be cross checked against the fabrication board model netlist to ensure that the board design was entered correctly and to ensure that the actual board design will support the desired functionality.

BRIEF SUMMARY OF THE INVENTION

In one representative embodiment, a design tool is provided that creates a hardware description language model of a printed circuit board. The design tool comprises an entry mechanism that receives part descriptions, part instances and part interconnections for the printed circuit board. A processor is connected to the entry mechanism and processes the part descriptions, part instances and part interconnections to generate an internal netlist of the printed circuit board. A compiler is connect to the processor and processes the part descriptions, the part instances and the part interconnections and the generated internal netlist to generate a hardware description language model of the printed circuit board. A netlist reader is connected to the compiler and reads a third party generated netlist of the printed circuit board. A netlist comparator is connected to the netlist reader, and the netlist comparator compares the third party generated netlist of the printed circuit board to the generated internal netlist. A report generator is connected to the netlist comparator and reports any differences between the third party generated netlist of the printed circuit board and the generated internal netlist.

In another representative embodiment, a method for creating a hardware description language model of a printed circuit board is provided. The method comprises entering part descriptions of the printed circuit board, part interconnections of the parts on the printed circuit board and part instances. An internal netlist is generated from the part descriptions, the interconnection of the parts and the part instances. An equivalence of the internal netlist to a third party generated netlist is verified. A hardware description language model of the printed circuit board is generated wherein the hardware description language model is substantially identical in connectivity to the printed circuit board.

DETAILED DESCRIPTION OF THE INVENTION

Figure 1:
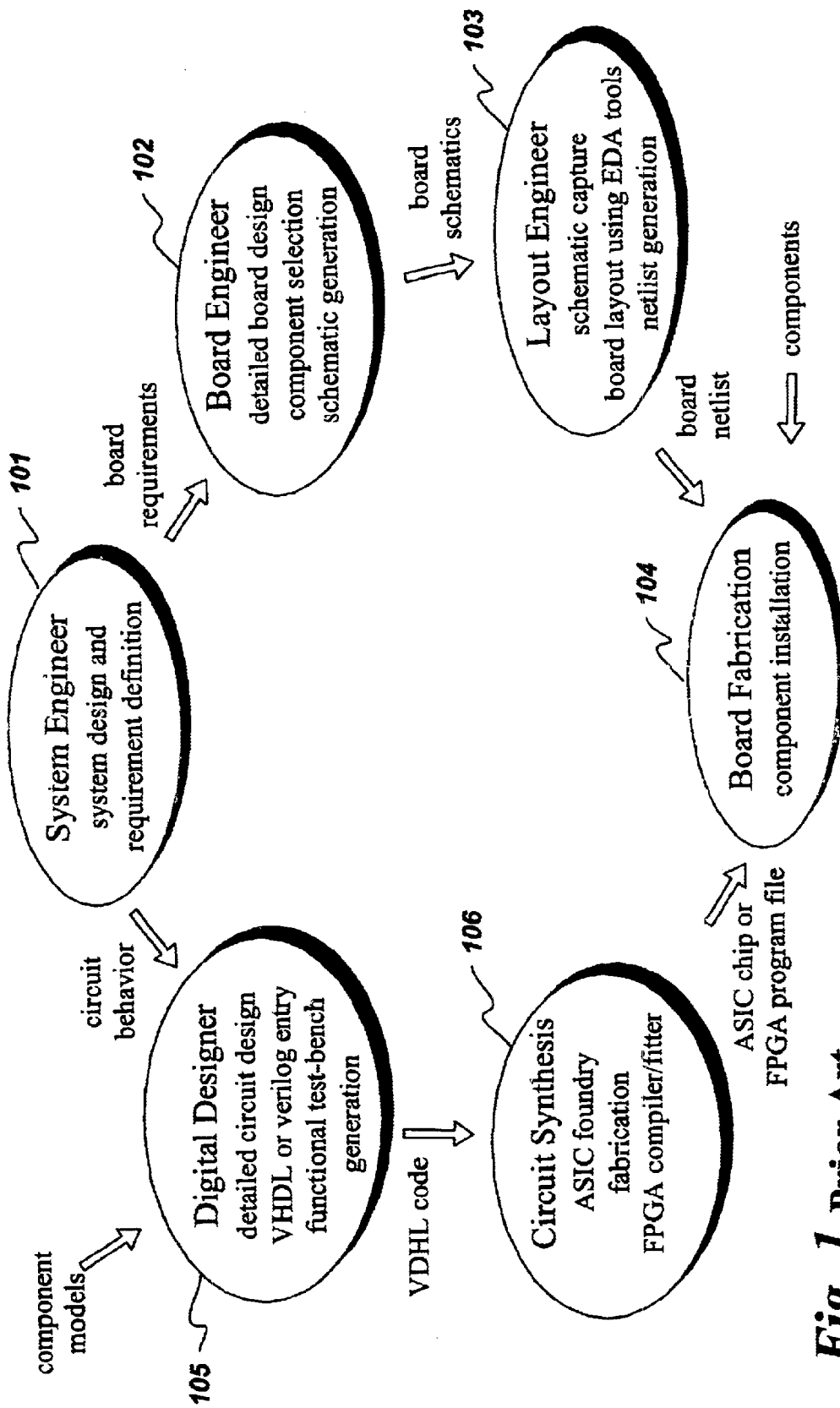
FIG. 1 (PRIOR ART) is a process map for ASIC, FPGA and board design or the existing process.

Referring to the figures, and more particularly to FIG. 1 (PRIOR ART), the design process for board design is provided. It should be appreciated that, in one embodiment, the design process and tool 201 described herein can be used for digital board design and modeling. In addition, it should also be appreciated that in another embodiment, the design process and tool can be used for analog board design and modeling. The system engineer in step 101 defines the board requirements and the behavior that the ASIC and FPGA components must have. The board requirements are given to a board designer, who in step 102 performs the detailed design of the board and chooses the parts required. This design is passed to another engineer, who in step 103 enters the board design, including the footprints, size, orientation, and connectivity into a board layout tool, such as, for example, the Cadence Leapfrog. The board layout tool ultimately outputs a board netlist that can be passed to a board fabrication center. Where in step 104, the board is manufactured and populated with the chosen components.

In parallel with these tasks, the system engineer often chooses to perform some of the required functionality of the board using application specific integrated circuits (ASICs) or field programmable gate arrays (FPGAs). The behavior of these parts is specified and is given to the digital designers, who in step 105 design the circuits and enter the design using a circuit definition language, such as VHDL. The VHDL definition of the parts is tested functionally using test-benches, also written in VHDL. In order to gain greater confidence in the designs, the test benches often include models of other board components which the ASICs or FPGAs must interact. Models of many complex parts, such as microprocessors, memories and other devices, are available to aid in this step. The digital designers can even model many portions of the board to gain confidence with their ASIC and FPGA designs. Ultimately, the digital designers' VHDL descriptions of the ASICs or FPGAs are compiled. In the case of ASICs, the VHDL descriptions are used as input to circuit synthesizer tools, such as, for example. Synopsys Design Analyzer, which outputs a description of the ASIC that can be sent to an ASIC foundry and fabricated in step 106. In the case of FPGAs, the VHDL code is synthesized and fitted into the chosen component using an FPGA synthesizer/fitter package, such as, for example, Altera Maxplus2. The output of the FPGA synthesizer/fitter package is a programming file that can be used to configure the FPGA while it is mounted on the board.

Errors in the process can originate from many sources. The original requirements defined by the system engineer may be inconsistent with the ultimate system functionality. The board designer and the engineer performing the schematic capture and layout of the board are prone to error. Also digital designers may implement functionality within the ASICs or FPGAs that is inconsistent with the desired system functionality. An error in any of the above steps is costly. A board design error may require a revision of the board, which will cost tens of thousands of dollars. An error in the design of an ASIC may require re-fabrication of the ASIC, that can easily cost hundreds of thousands of dollars.

Typically, the board design activities (steps 102–103) and the digital design activities (steps 105–106) are performed in parallel without formal interaction. It should be appreciated that the quality of both the board design activities and the digital design of the ASICs and FPGA components on the board can be improved by maintaining a close interaction between the activities.

Figure 2:
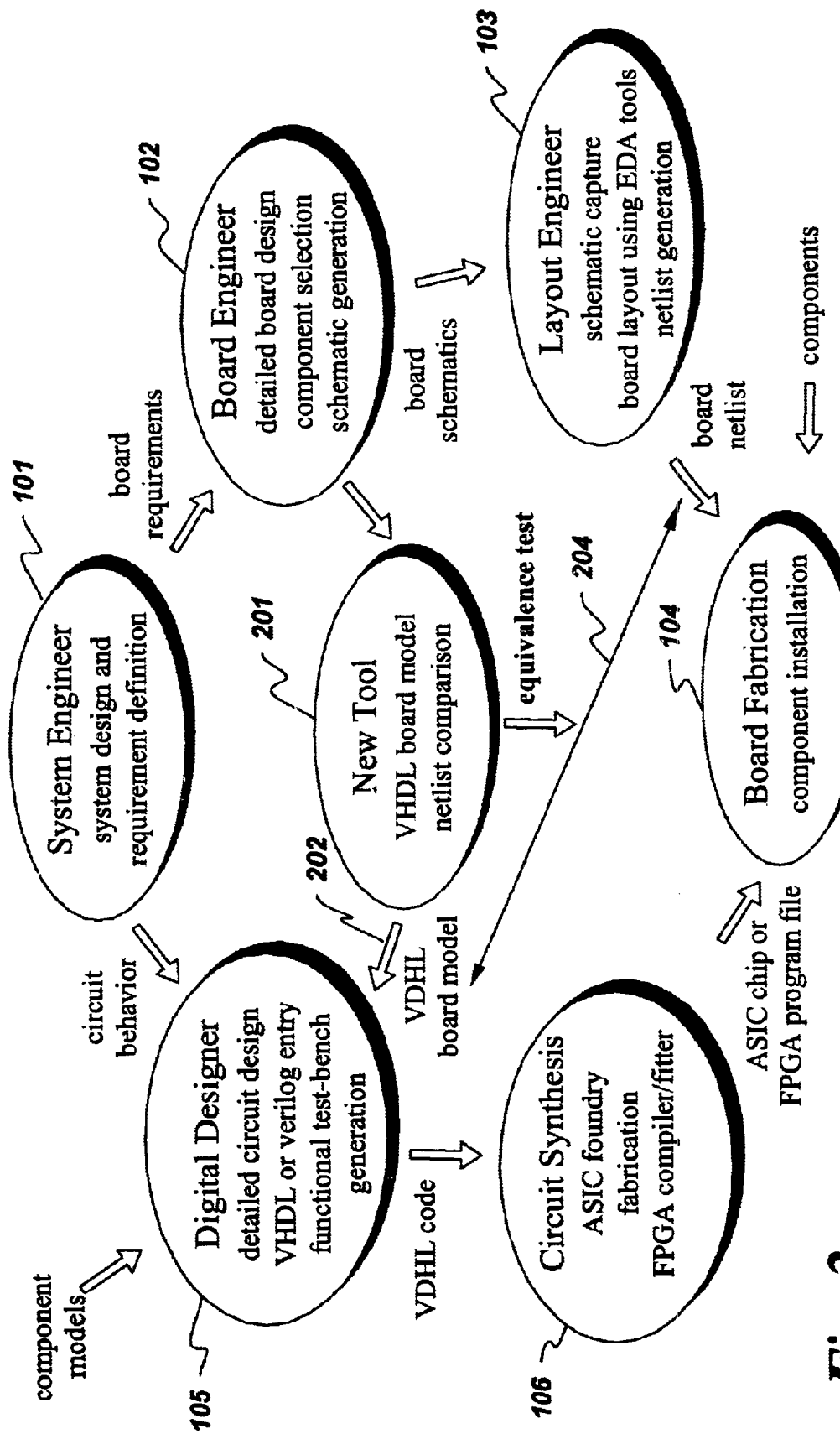
FIG. 2 is a process map for ASIC, FPGA and board design, showing how the new tool according to the invention works within the existing process.

In one embodiment, as shown in FIG. 2, a design tool 201 is implemented and is used to overcome some of the errors that may cause expensive re-work. As shown in FIG. 2, the tool 201 creates a VHDL board model 202 from board schematics supplied from step 102. In step 105, the VHDL board model 202 is used by the digital designers to verify the ASIC and FPGA designs. The VHDL board model 202 that is created is component and connectivity equivalent to the board that is entered into the board layout EDA tools in step 103. The equivalence is verified by comparing the output netlist 204 of the board layout automation tools and the board netlist of the VHDL board model 202.

The tool 201 operates by entering the board schematics that the board designer specifies. These schematics are compiled and converted to a VHDL description of the board by the tool 201. The VHDL description of the board is delivered to the digital designers to use in their test benches and functional verification stages. The VHDL board model 202 is used as part of the test bench that tests the functionality of the board. Any models of the component parts, such as memories, microprocessors and other components, can be instantiated in the VHDL board model 202 using a "configuration" statement in the VHDL language. Since the VHDL description of the board is based on the board designer's schematics, it verifies board connectivity.

At this stage, any inconsistencies between the board requirements and the ASIC and FPGA specifications can be identified. Inconsistencies are identified by the failure of the VHDL test benches. When a board connectivity error is identified, a revision to the board schematics can be made. Since the digital designers are performing functional tests in step 105 using a VHDL board model 202 generated by tool 201 that is substantially identical to the actual board that the parts are being designed into, the functional tests performed are closer to reality and provide a more reliable indication of correct performance. This design reduces the probability of incorrect behavior of the parts when they are installed on the actual hardware.

In another step that is performed by the tool 201, an equivalence test is performed between the VHDL board model 202 and the board netlist 204 at the output of the board layout EDA tools from step 103. This equivalence test identifies errors in entering the schematics into the board layout tool. Also, the equivalence test reduces the chance of error in schematic capture into the board layout tool 201, the test also validates correct entry of the board schematics into the VHDL board model generation section of the tool 201.

Since board schematics from the board designer are entered into tool 201, the output of the tool 201 is a VHDL board model 202 that digital designers can use within their test benches. As mentioned above, the tool 201 also performs an equivalence test between the board netlist 204 at the output of the board layout EDA tools and the VHDL board model 202. These new processes tightly couple the board design and the ASIC and FPGA activities at a number of places, reducing the change of expensive re-work.

Figure 3:
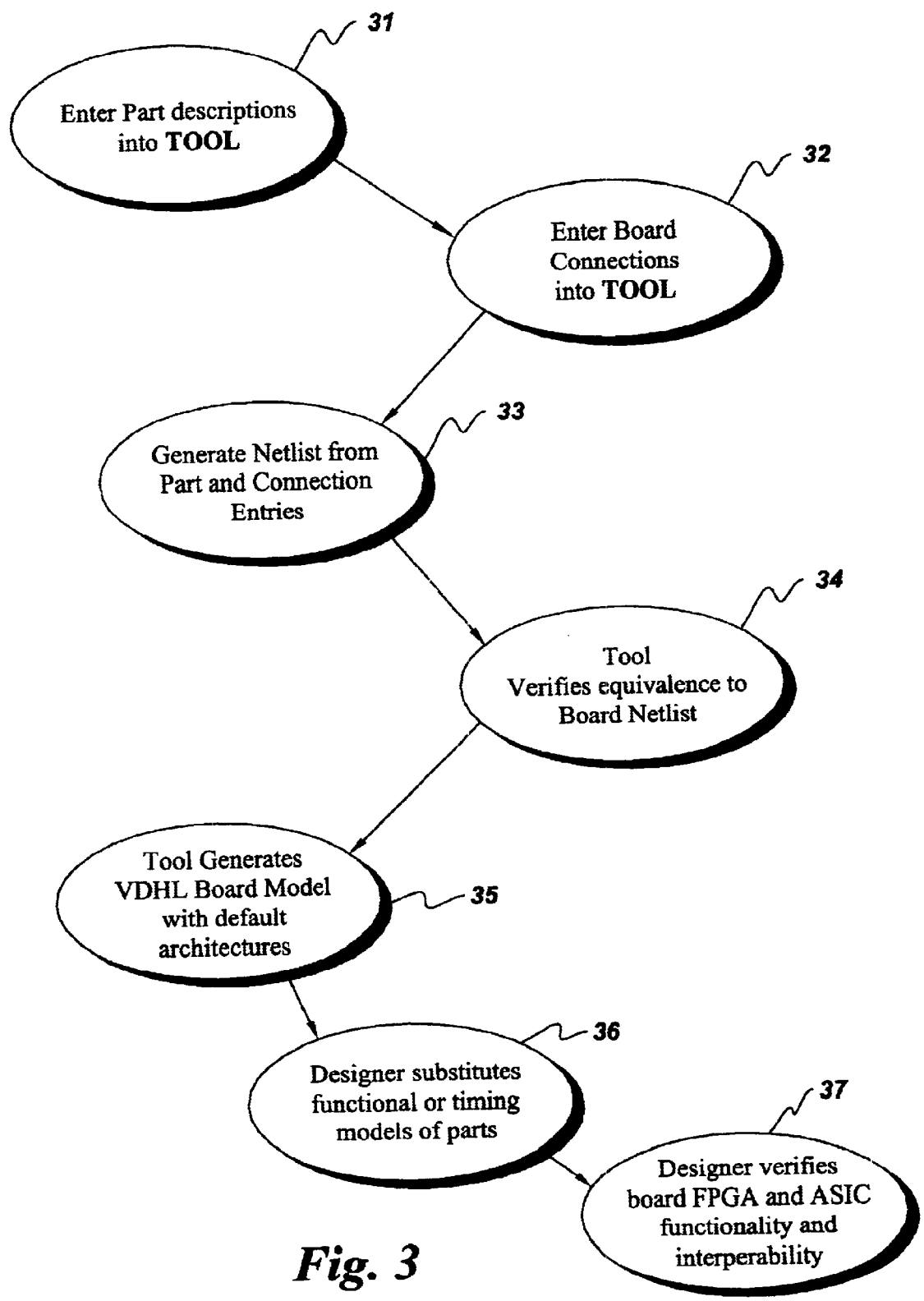
FIG. 3 is a flow diagram showing the operation of the one representative embodiment of the new tool.
Figure 5:
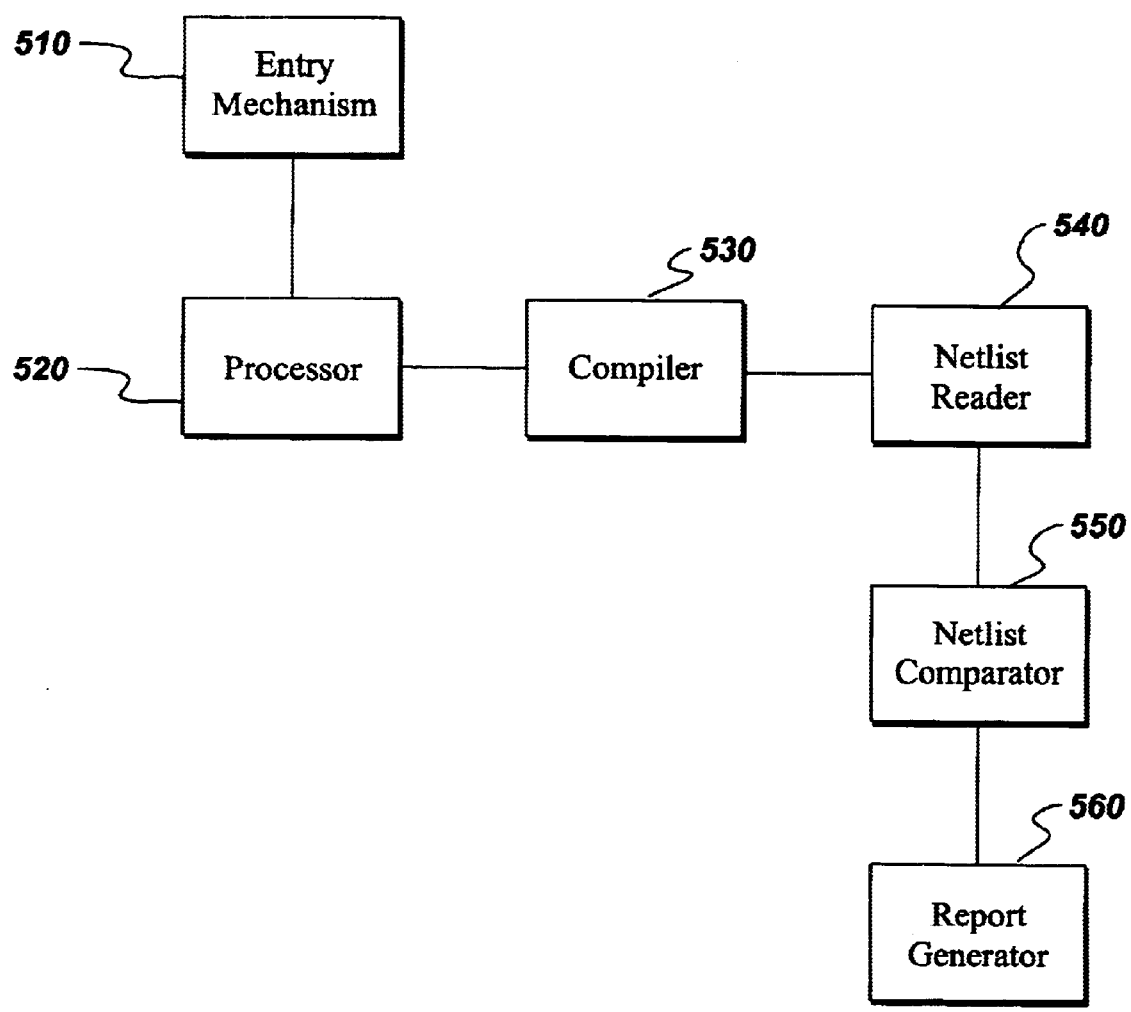
FIG. 5 is a block diagram of a representative embodiment a tool for improving a quality of digital board design and modeling.

Referring now to FIGS. 3 and 5, the part descriptions are entered into the tool 201 in step 31 via entry mechanism 510 (FIG. 5). In one embodiment, the inputs to the tool 201 are the types of parts that exist on the board, and each part is to be given a part definition. Part definitions include:
 a) a unique part name,
 b) number of ports or pins, and
 c) port list (for each port or pin) specification including
  i) a unique port (pin) name, and
  ii) port direction.

The type of board parts that can be included are integrated circuits, resistors, capacitors, connectors, analog ICs, test points, etc. The port directions will either be 1) input, 2) output, or 3) bidirectional. For example, the specification of a power-on reset IC part can be input as follows:

Part Name: MAX6306UK29D3_T
Number of Pins:5

| RESETB | output |
|---|---|
| GND | input |
| MRB | bidirectional |
| RST_IN | input |
| VCC3 | input |

For each part that is actually on the board, the part identifier, the part type and where each pin of that part is connected are specified in step 32. Instances of parts include:
 a) part name (must be in list of part definitions above),
 b) a unique instance name, and
 c) connection list (for each port or pin) including
  i) pin name (must be in Part Definition pin name list), and
  ii) net name to which pin is connected.

All pins that are in the part definition should be listed. Net names can be connected to more than one pin. There may be some pins that are left unconnected (in which case the net name 'NC' is reserved). For example, here is the instance definition for the power-on reset IC above is as follows:

| Part Name: | MAX6306UK29D3_T |
|---|---|
| Instance Name: | U30 |
| | Pin RESETB is connected to net LRESET_FPGA |
| | Pin GND is connected to net GND |
| | Pin MIRB is connected to net U30_MRB |

Pin RST_IN is connected to net LRESET
Pin VC-C is connected to net VCC3

In step 33, the tool 201 analyzes and processes the inputs using processor 520 connected to the entry mechanism 510. In addition, the tool 201 compiles the inputs using a compiler 530 connected to the processor 520 to generate a netlist that comprises a list of 'NET NAMES' and the part and the port/pin that part is connected. It should be appreciated that, in one embodiment, the compiler 530 can be comprised in the processor 520. In addition, it should be appreciated that the compiler 530 can comprise a software application that is executed by the processor 520. In step 34, the tool 201 uses a netlist reader 540 connected to the compiler 530 to read in the netlist 204 from the board layout schematic, and the tool 201 uses a netlist comparator 550 connected to the net list reader 540 to compare the board netlist against result of step 33 to verify that the lists are substantially identical. Additionally, the tool 201 uses a reporting mechanism 550 to report the differences between the board netlist and the netlist 204. The test of step 34 is also identified as the equivalence test as mentioned hereinabove. Next, in step 35, the tool 201 generates a VHDL board model 202 that can be used for VHDL simulations.

Figure 4:
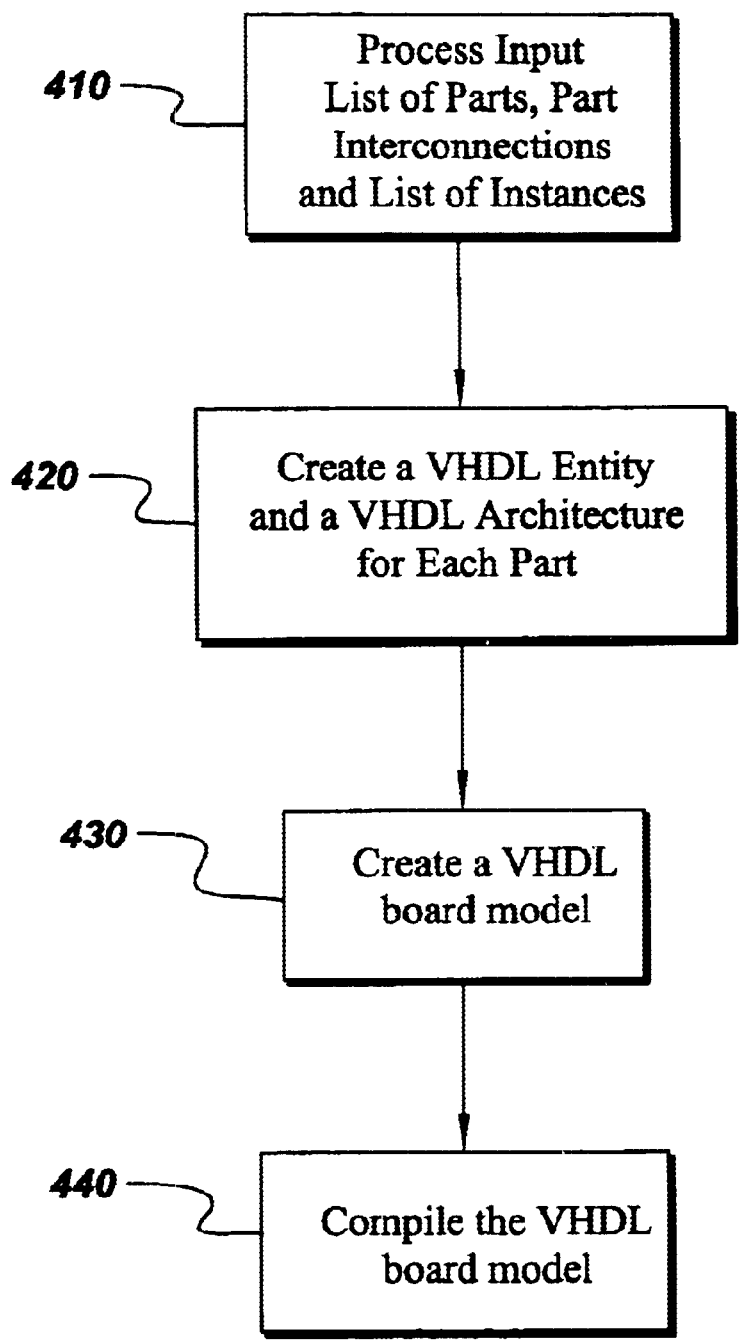
FIG. 4 is a flow diagram showing one representative embodiment of generating a VHDL board model.

In one embodiment, as shown if FIG. 4, the tool 201 implements step 35 by processing the input list of parts and the list of instances (step 410) to create the VHDL board model 202. After the input parts list is processed for each part, a VHDL entity is created, and a default VHDL architecture is created (step 420). In one embodiment, the VHDL entity is created by adding VHDL specific keywords and reformatting the part information to a form that can understood by a VHDL compiler. For example, the power-on reset IC part described above is reformatted into the following snippet of VHDL code, describing the physical description of the part:

```
entity MAX6306UK29D3_T is
  port
  (
    RESETB: out std_logic; - - PIN 1
    GND: in std_logic; - - PIN 2
    MRB inout std_logic; - - PIN 3
    RST_IN in std_logic; - - PIN 4
    VCC in std_logic - - PIN 5
  );
end MAX6306UK29D3_T;
```

The default architecture created defines a behavior for the part. Since the tool 201 does not know the actual behavior of the part, the VHDL designer or tester can substitute another model for this default architecture. In addition, a VHDL programmer can substitute an alternate architecture for the one created by the tool 201. The default architecture sets all outputs to logic level 0 and sets all bi-directional ports/pins to high impedance. For example, the power-on reset IC part described above is reformatted into the following snippet of VHDL code, describing the behavior of the part:

architecture xls of MAX6306UK29D3-T is
begin

```
RESETB <= '0';
MRB <= 'Z';
``` end xls;

After a VHDL entity and architecture for each part in the parts list is created, a VHDL board model 202 is created (step 430). In one embodiment, a first step is to create a VHDL entity description for the board. A board without any input and output pins is created by the following VHDL snippet:
entity the_board is
end the_board;

Typically, however, a VHDL programmer would use a board model where a number of input and output ports/connections are defined. These definitions can be performed manually by the VHDL programmer, or the definition can be performed by an automated mechanism for specifying which board nets are to be inputs and outputs to the board. The tool 201 flags all connector-type parts, and all of the ports/pins are also flagged as ports/pins of the board. For example, a JTAG header connector on the board can have a part description as follows:

Part Name: PIN 10 JTAG (connector)
Number of Pins: 10
  SER_P2                         bidirectional
  SER_P10                       bidirectional
  SER_P6                         bidirectional SER_P7                         bidirectional
  SER_P8                         bidirectional
  SER_P1                         bidirectional
  SER_P9                         bidirectional
  SER_P3                         bidirectional
  SER_P5                         bidirectional
  SER_P4                         bidirectional and the JTAG header connector can have an instance definition as follows:

Part Name: PIN 10 JTAG
Instance Name: J6
    Pin SER_P2 is connected to net GND
    Pin SER_10 is connected to net GND
    Pin SER_P6 is connected to net NC
    Pin SER_P7 is connected to net NC
    Pin SER_P8 is connected to net NC
    Pin SER_P1 is connected to net TCK
    Pin SER_P9 is connected to net TDI DAP2
    Pin SER_P3 is connected to net TDO EP2
    Pin SER_P5 is connected to net TMS
    Pin SER_P4 is connected to net VCC3

As described above, the reserved word 'NC' specifies that the pin is left unconnected and therefore is not truly a net name on the board. The other six words, GND, TCK, TDI-DAP2, TDO I EP2, TMS and VCC3, are net names that are to be placed on as inputs/outputs of the board model. Also in this example above, the net names GND and VCC3 are connected to the example power-on reset IC. The board model entity with these inputs and outputs can be presented as follows:

```
entity the_board is
    port
    (
        GND inout std_logic; - - J6
        TCK inout std_logic; - - J6
        TDI_DAP2 inout std_logic; - - J6
        TDO_EP2 inout std_logic; - - J6
        TMS inout std_logic; - - J6
        VCC3 inout std_logic - - J6
    );
end the_board;
```

It should be appreciated that other connectors and other inputs and outputs could be defined in other embodiments.

As discussed hereinabove, in one embodiment, the instance list is processed (step 410), and a VHDL architecture of the board is generated (step 420). The beginning and the end of the file are written similar to the default architecture for the individual components. For example, the VHDL architecture can begin with the following:
architecture xls of dfn_board is
and the VHDL architecture can end with the following:
end xls;

With VHDL, all the parts used in the board should be listed. The VHDL syntax is similar to VHDL entity definition. The part definition list is again processed to generate the following: (for the example power-on reset IC)
component MAX(5306UK29D3_T is

```
    port
    (
        RESETB out std_logic;- - PIN I
        GND in std_logic; - - PIN 2
        MRB inout std_logic; - - PIN 3
        RST_IN in std_logic; - - PIN 4
        VCC in std_logic - - PIN 5
    );
``` and the JTAG connector generates the following:

```
component PIN_10_JTAG
    port
    (
        SER_P2 inout std_logic; - - PIN 2
        SER_P10 inout std_logic; - - PIN 10
        SER_P6 inout std_logic; - - PIN 6
        SER_P7 inout std_logic; - - PIN 7
        SER_P8 inout std_logic; - - PIN 8
        SER_P1 inout std_logic; - - PIN 1
        SER_P9 inout std_logic; - - PIN 9
        SER_P3 inout std_logic; - - PIN 3
        SER_P5 inout std_logic; - - PIN 5
        SER_P4 inout std_logic - - PIN 4
    );
``` end component;

After the list of components is generated, a list of all net names on the board is also listed (using VHDL syntax). However, the net names that are included in the board entity definition are not included in this list. Continuing with the example of the power-on reset IC, the nets LRESET_FPGA, U30_MRB, and RESET are connected to it and are not included on the board entity definition. Therefore, these net names are listed using VHDL syntax as follows:

```
signal    LRESET_FPGA    : std_logic;
signal    U30_MRB        : std_logic;
signal    RESET          : std_logic
```

The rest of the VHDL board model 202 needs to be enclosed within a 'begin' and 'end' statement in VHDL. All of the instances of parts are processed and formatted using VHDL syntax. The example power-on reset IC can be written as follows:
U30:MAX6306UK29D3_T

```
port map
(
    RESETB    => LRESET-FPGA,
    GND       => GND,
    MRB       => U30_MRB,
    RST-IN    => LRESET,
    VCC       => VCC3
);
``` and the example connector can be written as follows:
J6:PIN 10 JTAG

```
port map
(
    SER_P2 => GND,
    SER_P10 => GND,
    SER_P6 => OPEN,
    SER_P7 => OPEN,
    SER_P8 => OPEN,
    SER_P1 => TCK,
    SER_P9 => TDI-DAP2,
    SER_P3 => TDO-EP2,
    SER_PS => TMS,
    SER_P4 => VCC3
);
```

The VHDL board models 202 are compiled (step 440) as described above and written to individual files. These files can be compiled using the digital designer's VHDL simulator of choice. The VHDL board model 202 created accurately represents the connectivity of the board. This highly accurate VHDL board model 202 reduces the time needed for integration the board after it is manufactured, and reduced the risk of board redesign because the VHDL board model 202 was cross-checked against the netlist 204 from board layout.

As mentioned above, the VHDL board model 202 that the tool 201 generates is an accurate representation of the interconnections between the parts on the board. In order for a designer to use the VHDL board model 202, some or all of the parts on the board should be substituted with functional models that represent the parts, as shown in step 36 of FIG. 3.

It should be appreciated that alternate models of the parts can substituted in a number of ways, and these alternative VHDL architectures are included in the simulation using a "configuration statement" in VHDL. In one embodiment, the alternate VHDL architecture can be a simple model of the part. In another embodiment, the alternative VHDL architecture can be a design of a programmable part such as an ASIC or a FPGA. In even another embodiment, VHDL architecture models for parts can be purchased, leased or licensed. For example, some companies maintain a part model library of a larger number of commercial chips, and these part model libraries are available for commercial leasing and/or licensing.

The board model, with the substituted part models, becomes a platform in which to test the design in step 37 of FIG. 3. The board model can be used to verify that the interconnectivity between parts supports the desired function. Also, the VHDL board model 202 is used to verify that all the parts perform their desired functions. If there is a problem, i.e., the test benches fail, then changes need to be made to the design. The different type of design changes that could rectify the failures in the test benches are:

1. Changes in the specification of the programmable parts;
2. Changes in the board design; and
3. Changes in the part selection.

Changes in the specification of the programmable parts are remedied by changes in the VHDL (or Verilog) code that define the programmable part. Changes in the board design or changes in the part selection involve board changes. If this occurs, re-entry of the changes needs to be made by, for example, returning to step 31 or 32 of FIG. 3.

The process continues until all the desired functionality and interoperability is verified, and it should be appreciated that the process can return to step 31 or 32 a number of times during the verification of the board model. When the functionality of the VHDL board model 202 is verified to the satisfaction of the design team, the board can be released for manufacturing with a low risk of expensive rework.

The foregoing discussion of the invention has been presented for purposes of illustration and description. Further, the description is not intended to limit the invention to the form disclosed herein. Consequently, variations and modifications commensurate with the above teachings and with the skill and knowledge of the relevant art are within the scope of the present invention. The embodiment described herein above is further intended to explain the best mode presently known of practicing the invention and to enable others skilled in the art to utilize the invention as such, or in other embodiments, and with the various modifications required by their particular application or uses of the invention. It is intended that the appended claims be construed to include alternative embodiments to the extent permitted by the prior art.

What is claimed is:

1. A design tool that creates a hardware description language model of a printed circuit board, the design tool comprising:
   an entry mechanism for entering part descriptions, part instances and part interconnections for the printed circuit board;
   processing means for processing the part descriptions, part instances and part interconnections to generate an internal netlist of the printed circuit board; and
   compiling means for processing the part descriptions, the part instances and the part interconnections and the generated internal netlist to generate the hardware description language model of the printed circuit board wherein the hardware description language model of the printed circuit board is substantially identical in connectivity to the printed circuit board.

2. The design tool of claim 1 wherein the hardware description language is Very High Speed Integrated Circuits (VHSIC) Hardware Description Language (VHDL).

3. The design tool of claim 1 wherein the hardware description language is Verilog hardware description language.

4. The design tool of claim 1 wherein the printed circuit board is a design of a printed circuit board that is being considered for manufacturing.

5. The design tool of claim 1 wherein the printed circuit board is a printed circuit board that has previously been manufactured.

6. The design tool of claim 1 wherein the printed circuit board is a digital printed circuit board.

7. The design tool of claim 1 wherein the printed circuit board is an analog printed circuit board.

8. A design tool which creates a hardware description language model of a printed circuit board, the design tool comprising:
   an entry mechanism for entering part descriptions, part instances and part interconnections for the printed circuit board;
   processing means for processing the part descriptions, part instances and part interconnections to generate an internal netlist of the printed circuit board;
   compiling means for processing the part descriptions, the part instances and the part interconnections and the generated internal netlist to generate a hardware description language model of the printed circuit board;
   a netlist reader for reading a third party generated netlist of the printed circuit board;
   netlist comparison means for comparing the third party generated netlist of the printed circuit board to the generated internal netlist; and
   reporting means for reporting any differences between the third party generated netlist of the printed circuit board and the generated internal netlist.

9. The design tool of claim 8 wherein the hardware description language is Very High Speed Integrated Circuits (VHSIC) Hardware Description Language (VHDL).

10. The design tool of claim 8 wherein the hardware description language is Verilog hardware description language.

11. The design tool of claim 8 wherein the printed circuit board is a design of a printed circuit board that is being considered for manufacturing.

12. The design tool of claim 8 wherein the printed circuit board is a printed circuit board that has previously been manufactured.

13. The design tool of claim 8 wherein the printed circuit board is a digital printed circuit board.

14. The design tool of claim 8 wherein the printed circuit board is a analog printed circuit board.

15. A design tool that creates a hardware description language model of a printed circuit board, the design tool comprising:
   an entry mechanism receiving part descriptions, part instances and part interconnections for the printed circuit board;
   a processor connected to the entry mechanism, the processor processing the part descriptions, part instances and part interconnections to generate an internal netlist of the printed circuit board; and
   a compiler connected to the processor and processing the part descriptions, the part instances and the part interconnections and the generated internal netlist to generate the hardware description language model of the printed circuit board wherein the hardware description language model of the printed circuit board is substantially identical in connectivity to the printed circuit board.

16. The design tool of claim 15 wherein the hardware description language is Very High Speed Integrated Circuits (VHSIC) Hardware Description Language (VHDL).

17. The design tool of claim 15 wherein the hardware description language is Verilog hardware description language.

18. The design tool of claim 15 wherein the printed circuit board is a design of a printed circuit board that is being considered for manufacturing.

19. The design tool of claim 15 wherein the printed circuit board is a printed circuit board that has previously been manufactured.

20. The design tool of claim 15 wherein the printed circuit board is a digital printed circuit board.

21. The design tool of claim 15 wherein the printed circuit board is a analog printed circuit board.

22. A design tool which creates a hardware description language model of a printed circuit board, the design tool comprising:

an entry mechanism receiving part descriptions, part instances and part interconnections for the printed circuit board;

a processor connected to the entry mechanism and processing the part descriptions, part instances and part interconnections to generate an internal netlist of the printed circuit board;

a compiler connected to the processor and processing the part descriptions, the part instances and the part interconnections and the generated internal netlist to generate a hardware description language model of the printed circuit board;

a netlist reader connected to the compiler and reading a third party generated netlist of the printed circuit board;

a netlist comparator connected to the netlist reader, the netlist comparator comparing the third party generated netlist of the printed circuit board to the generated internal netlist; and a report generator connected to the netlist comparator for reporting any differences between the third party generated netlist of the printed circuit board and the generated internal netlist.

23. The design tool of claim 22 wherein the hardware description language is Very High Speed Integrated Circuits (VHSIC) Hardware Description Language (VHDL).

24. The design tool of claim 22 wherein the hardware description language is Verilog hardware description language.

25. The design tool of claim 22 wherein the printed circuit board is a design of a printed circuit board that is being considered for manufacturing.

26. The design tool of claim 22 wherein the printed circuit board is a printed circuit board that has previously been manufactured.

27. The design tool of claim 22 wherein the printed circuit board is a digital printed circuit board.

28. The design tool of claim 22 wherein the printed circuit board is a analog printed circuit board.

29. A method for creating a hardware description language model of a printed circuit board, the method comprising the steps of:

entering part descriptions of the printed circuit board;

entering part interconnections of the parts on the printed circuit board;

entering part instances;

generating an internal netlist from the part descriptions, the interconnection of the parts and the part instances;

verifying an equivalence of the internal netlist to a third party generated netlist; and generating a hardware description language model of the printed circuit board wherein the hardware description language model is substantially identical in connectivity to the printed circuit board.

30. The method of claim 29 wherein the hardware description language is Very High Speed Integrated Circuits (VHSIC) Hardware Description Language (VHDL).

31. The method of claim 29 wherein the hardware description language is Verilog hardware description language.

32. The method of claim 29 wherein the printed circuit board is a digital printed circuit board.

33. The method of claim 29 wherein the printed circuit board is a analog printed circuit board.

34. A method for creating a hardware description language model of a printed circuit board, the method comprising the steps of:

entering part descriptions of the printed circuit board;

entering part interconnections of the parts on the printed circuit board;

entering part instances;

generating an internal netlist from the part descriptions, the interconnection of the parts and the part instances;

verifying an equivalence of the internal netlist to a third party generated netlist;

processing the part descriptions, the part interconnections and the part instances;

create a hardware description language model entity and a hardware description language model architecture for each part;

generating a hardware description language model of the printed circuit board wherein the hardware description language model of the printed circuit board is substantially identical in connectivity to the printed circuit board; and compiling the hardware description language model.

35. The method of claim 34 wherein the hardware description language is Very High Speed Integrated Circuits (VHSIC) Hardware Description Language (VHDL).

36. The method of claim 34 wherein the hardware description language is Verilog hardware description language.

37. The method of claim 34 wherein the printed circuit board is a digital printed circuit board.

38. The method of claim 34 wherein the printed circuit board is a analog printed circuit board.

* * * * *